(12) United States Patent
Deshpande et al.

(10) Patent No.: US 11,404,121 B2
(45) Date of Patent: Aug. 2, 2022

(54) METHODS FOR WRITING TERNARY CONTENT ADDRESSABLE MEMORY DEVICES

(71) Applicant: MEDIATEK Singapore Pte. Ltd., Singapore (SG)

(72) Inventors: Chetan Deshpande, San Jose, CA (US); Ritesh Garg, San Jose, CA (US); Gajanan Sahebrao Jedhe, San Jose, CA (US); Gaurang Prabhakar Narvekar, San Jose, CA (US)

(73) Assignee: MEDIATEK Singapore Pte. Ltd., Singapore (SG)

( * ) Notice: Subject to any disclaimer, the term of this patent is extended or adjusted under 35 U.S.C. 154(b) by 0 days.

(21) Appl. No.: 17/074,789

(22) Filed: Oct. 20, 2020

(65) Prior Publication Data
US 2021/0118506 A1 Apr. 22, 2021

(30) Foreign Application Priority Data
Oct. 22, 2019 (IN) .............................. 201921042894

(51) Int. Cl.
*G11C 15/04* (2006.01)
*G11C 7/22* (2006.01)
*G11C 11/412* (2006.01)
*G11C 11/413* (2006.01)

(52) U.S. Cl.
CPC ................ *G11C 15/04* (2013.01); *G11C 7/22* (2013.01); *G11C 11/412* (2013.01); *G11C 11/413* (2013.01); *G11C 2207/229* (2013.01)

(58) Field of Classification Search
CPC ......... G11C 15/04; G11C 7/22; G11C 11/412; G11C 11/413; G11C 2207/229
See application file for complete search history.

(56) References Cited

U.S. PATENT DOCUMENTS

| 5,841,874 A | 11/1998 | Kempke et al. |
| 8,848,412 B1 | 9/2014 | Yeung et al. |
| 2017/0062051 A1* | 3/2017 | Watanabe .............. G11C 15/04 |

OTHER PUBLICATIONS

Extended European Search Report dated Mar. 1, 2021 in connection with European Application No. 20203016.9.
EP 20203016.9, Mar. 1, 2021, Extended European Search Report.

* cited by examiner

*Primary Examiner* — Jay W. Radke
(74) *Attorney, Agent, or Firm* — Wolf, Greenfield & Sacks, P.C.

(57) ABSTRACT

Ternary content-addressable memory (TCAM) devices are described. The TCAMs described herein are designed to perform write operations—including data writes and mask writes—in a single clock cycle. For example, data input is written in a row of the TCAM during the first portion of a clock cycle, and a mask is written in another row of the TCAM during the second portion of the clock cycle. In one implementation, a first bus is used both for data write and key search operations, and a second bus is used both for mask write and search masking operations. In another implementation, a first bus is used both for data write and key search operations, a second bus is used for mask write operations, and a third bus is used for search masking operations.

9 Claims, 9 Drawing Sheets

| X (data) | Y (mask) | State |
|---|---|---|
| 1 | 0 | 1 |
| 0 | 1 | 0 |
| 1 | 1 | "don't care" |
| 0 | 0 | N.A. |

METHODS FOR WRITING TERNARY CONTENT ADDRESSABLE MEMORY DEVICES

CROSS REFERENCE TO RELATED APPLICATIONS

This application claims priority under 35 U.S.C. § 119 to Indian Patent Application No. 201921042894, entitled "TERNARY CONTENT ADDRESSABLE MEMORY WITH SINGLE CYCLE ATOMIC WRITE OPERATION" filed on Oct. 22, 2019, which is herein incorporated by reference in its entirety.

BACKGROUND

Content-addressable memory (CAM) is a type of computer memory that is specifically designed for search-intensive applications. Because of its parallel nature, CAMs are much faster than random access memory (RAM) architectures for searching. CAMs are often used in internet routers and switches, where they increase the speed of route look-up, packet classification and packet forwarding.

Ternary CAMs, or TCAMs, are designed to store and query data using three different inputs: 0, 1 and X. The "X" input, which is often referred to as a "don't care" or "wildcard" state, enables TCAMs to perform broader searches based on pattern matching, as opposed to binary CAM, which performs exact-match searches using only 0s and 1s.

BRIEF SUMMARY

Some embodiments relate to an apparatus comprising a ternary content addressable memory (TCAM) comprising a first plurality of rows of memory cells configured to store a plurality of respective data inputs; and a second plurality of rows of memory cells configured to store a plurality of respective masks; and control circuitry configured to: write a data input in a row of the first plurality of rows of memory cells in a first clock cycle, and write a mask in a row of the second plurality of rows of memory cells in the first clock cycle.

The control circuitry may be configured to write the data input in the row of the first plurality of rows of memory cells in response to a first edge of the first clock cycle and may be further configured to write the mask in the row of the second plurality of rows of memory cells in response to a second edge of the first clock cycle.

The row of the first plurality of rows and the row of the second plurality of rows may share a common address.

The row of the first plurality of rows and the row of the second plurality of rows may be located adjacent to one another.

The TCAM may further comprise a first bus and a second bus, wherein the control circuitry is configured to: write the data input in the row of the first plurality of rows of memory cells using the first bus, and write the mask in the row of the second plurality of rows of memory cells using the second bus.

The control circuit may be further configured to use the first bus to search a key in the first plurality of rows of memory cells.

The control circuit may be further configured to use the second bus to mask one or more columns of the TCAM during a search operation.

The TCAM may further comprises first, second and third buses, wherein the control circuitry is configured to: write the data input in the row of the first plurality of rows of memory cells using the first bus, write the mask in the row of the second plurality of rows of memory cells using the second bus, and use the third bus to mask one or more columns of the TCAM during a search operation.

Some embodiments relate to an apparatus comprising a ternary content addressable memory (TCAM) comprising: a first plurality of rows of memory cells configured to store a plurality of respective data inputs; a second plurality of rows of memory cells configured to store a plurality of respective masks; and first and second buses; and control circuitry configured to: write a data input in a row of the first plurality of rows of memory cells using the first bus, write a mask in a row of the second plurality of rows of memory cells using the second bus, and use the first bus or the second bus to mask one or more columns of the TCAM during a search operation.

The row of the first plurality of rows and the row of the second plurality of rows may share a common address.

The row of the first plurality of rows and the row of the second plurality of rows may be located adjacent to one another.

The control circuitry may be configured to write the data input in the row of the first plurality of rows of memory cells in response to a first edge of a clock cycle and may be further configured to write the mask in the row of the second plurality of rows of memory cells in response to a second edge of the clock cycle.

The control circuit may be further configured to use the first bus or the second bus to search a key in the first plurality of rows of memory cells.

Some embodiments relate to a method for writing a ternary content addressable memory (TCAM) comprising: in a first clock cycle, writing a data input in a row of a first plurality of rows of memory cells, wherein the first plurality of rows of memory cells is configured to store a plurality of respective data inputs; and in the first clock cycle, writing a mask in a row of a second plurality of rows of memory cells, wherein the second plurality of rows of memory cells is configured to store a plurality of respective masks.

Writing the data input may comprise writing the data input in response to a first edge of the first clock cycle and wherein writing the mask may comprise writing the mask in response to a second edge of the first clock cycle.

The row of the first plurality of rows and the row of the second plurality of rows may be located adjacent to one another.

Writing the data input may comprise writing the data input using a first bus and wherein writing the mask may comprise writing the mask using a second bus.

The method may further comprise using the first bus to search a key in the first plurality of rows of memory cells.

The method may further comprise using the second bus to mask one or more columns of the TCAM during a search operation.

Writing the data input may comprise writing the data input in response to a first edge of the first clock cycle and wherein writing the mask may comprise writing the mask after a predetermined time interval of the first clock edge.

The foregoing summary is provided by way of illustration and is not intended to be limiting.

BRIEF DESCRIPTION OF DRAWINGS

The accompanying drawings are not intended to be drawn to scale. In the drawings, each identical or nearly identical component that is illustrated in various figures is represented by a like numeral. For purposes of clarity, not every component may be labeled in every drawing.

FIG. 1A is a block diagram illustrating a ternary content-addressable memory (TCAM), in accordance with some embodiments.

FIG. 1B is a table may be used to determine the state of the TCAM of FIG. 1A, in accordance with some embodiments.

DETAILED DESCRIPTION

Figure 2A:
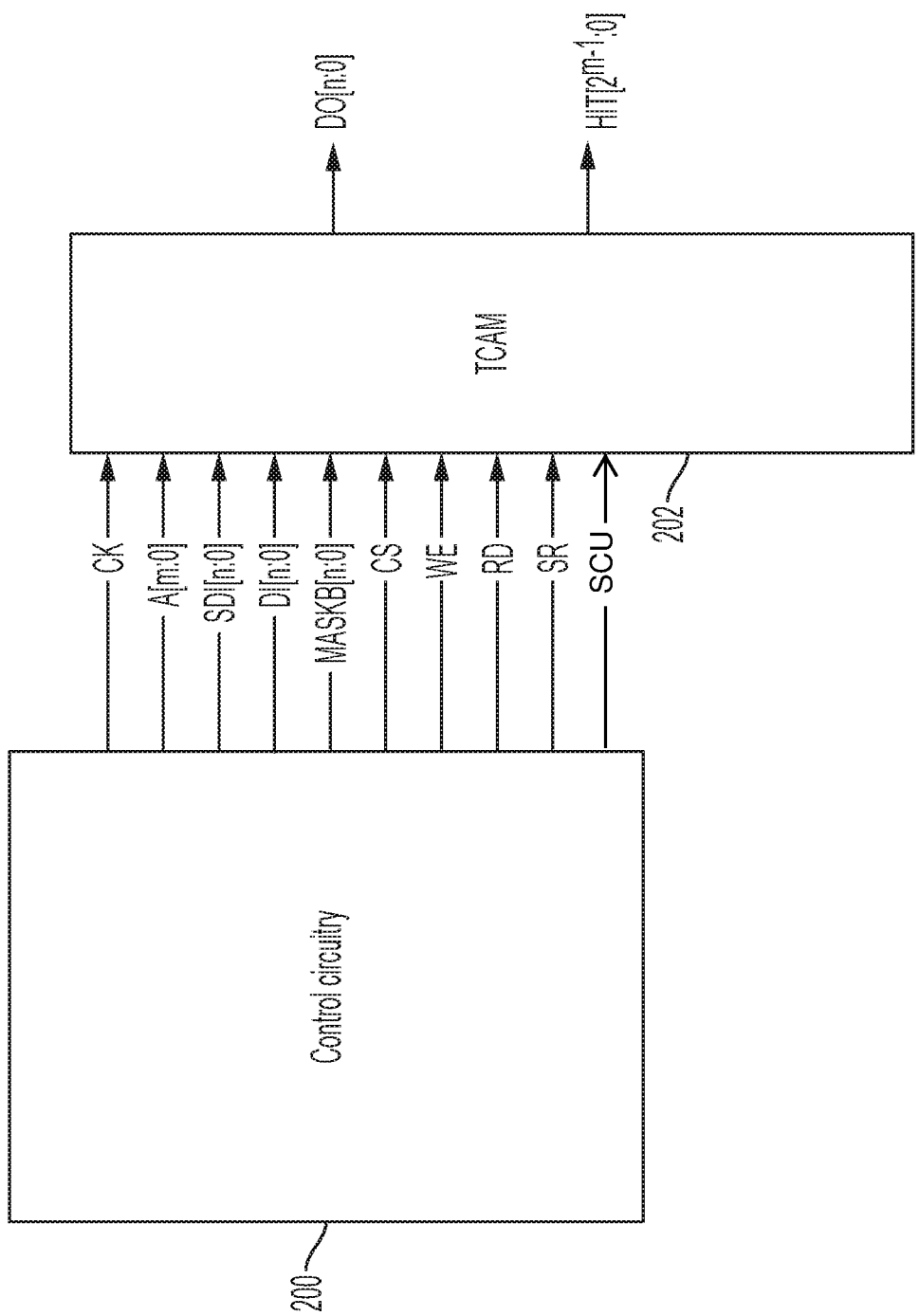
FIG. 2A is a block diagram illustrating a TCAM architecture, in accordance with some embodiments.

The inventors have recognized and appreciated that, as modern applications such as artificial intelligence, databases, and network switching drive an ever-increasing demand for network bandwidth, there is an increasing need for high-speed memories, and more particularly, for high-speed TCAMS. TCAMs have architectures that make them particularly suitable for use in computer networking devices, such as switches and routers. While the speed at which TCAMs can operate has significantly increased in recent years, the speed is still insufficient to meet the requirements of certain network applications.

The inventors have further recognized and appreciated that increasing the speed at which TCAMs perform write operations would significantly enhance the applicability of these types of memories. Accordingly, the inventors have developed TCAM architectures designed to increase the speed of write operations. The TCAMs architectures developed by the inventors are designed to perform write operations—including data writes and mask writes—in a single clock cycle. In some embodiments, for example, data input is written in a data row of the TCAM entry during the first portion of a clock cycle, and a mask is written in a mask row of the TCAM entry during the second portion of the same clock cycle.

Some embodiments are directed to a TCAM architecture in which a first bus is used both for data write and key search operations, and a second bus is used both for mask write and search masking operations. During a write operation, the first bus conveys a data input to a data row of the TCAM entry, and, during the same clock cycle, the second bus conveys a mask (referred to as the "local mask") to the corresponding mask row of TCAM entry. During a search operation, the first bus conveys the key to be searched to the TCAM, and the second bus conveys bits for masking the key search (these bits are referred to as the "column mask"). Masking a key search involves returning a result (in the form of a match or a miss) independently of the values of the masked column. For example, when a particular bit of the mask is asserted, the corresponding column of the TCAM is masked, meaning that the memory can return a match whether or not that particular column produces a match.

Alternatively, the opposite configuration is also possible—the first bus may be used both for data write and search masking operations, and the second bus may be used both for mask write and key search operations.

Other embodiments are directed to a TCAM architecture in which a first bus is used both for data write and key search operations, a second bus is used for mask write operations, and a third bus is used for search masking operations. During a write operation, the first bus conveys a data input to data row of a TCAM entry, and, during the same clock cycle, the second bus conveys a mask (referred to as the "local mask") to the corresponding mask row of the TCAM entry. During a search operation, the first bus conveys the key to be searched to the TCAM, and the third bus conveys bits for masking the key search (these bits are referred to as the "column mask"). Other configurations are also possible. For example, the second bus may be used instead of the first bus for key search operation.

Figures 1A, 1B:
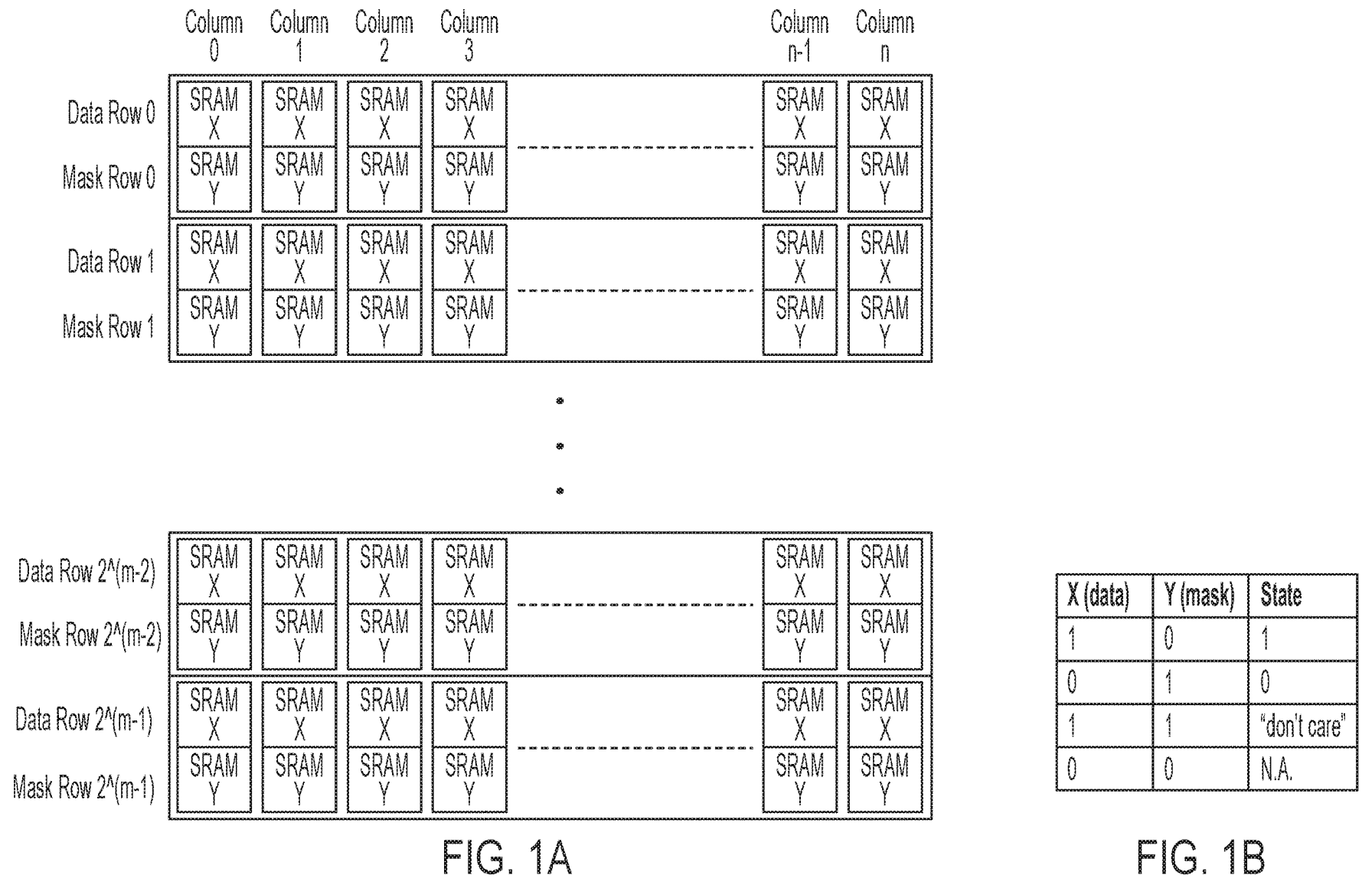

FIG. 1A illustrates a TCAM in accordance with some embodiments. The TCAM includes an array of memory cells arranged in rows and columns. Each cell includes a static random access memory (SRAM), though other types of memories may alternatively, or additionally, be used. The TCAM has a plurality of columns (0, 1, 2, 3 . . . n−1, n) and a plurality of rows (0, 1 . . . $2^{m-1}$). Each row includes a pair of sub-rows. The first sub-row (the "data row") is configured to store data and the second sub-row (the "mask row") is configured to store masks. Data bits are identified by the letter "X" and local mask bits are identified by the letter "Y". The data row and the mask row of a common TCAM entry may be located adjacent to one another in the TCAM. In some embodiments, the data row and the local mask row of a common TCAM entry share a common memory address, thereby reducing, by one unit, the number of bits required to address the entire memory.

Each local mask contains multiple bits. The value of each local mask bit determines whether the corresponding data bit is to be masked or not. A representative logic by which the local mask operates is illustrated in the table of FIG. 1B, in accordance with some embodiments. In this example, the state of a particular bit is 1 when the data is set to 1 and the local mask is set to 0. In contrast, the state of a particular bit is 0 when the data is set to 0 and the local mask is set to 1. When both the local mask and the data are set to 1, the state of the corresponding data bit is "don't care." Lastly, the combination in which the both the local mask and the data are set to 0 is not supported. It should be appreciated that logics other than that depicted in FIG. 1B are also possible, as bit masking is not limited to any specific logic.

FIG. 2A is a block diagram illustrating a TCAM architecture, in accordance with some embodiments. This architecture includes control circuitry 200 and TCAM 202. TCAM 202 may be arranged in accordance with the diagram illustrated in FIG. 1A. This architecture is designed to increase the speed of write operations into a TCAM relative to previous implementations. More specifically, this architecture is designed to write a data input and a local mask in a single clock cycle. For example, in the same clock cycle, a data input may be written into data row 0 and a local mask may be written into mask row 0. The buses of the TCAM are arranged to support write operations of data input and masks in single clock cycles. As shown in FIG. 2A, control circuitry 200 communicates with TCAM 202 using the following buses: CK, A, SDI, DI, MASKB, CS, WE, RD, SCU and SR.

Control circuitry 200 provides a clock to the TCAM 202 via bus CLK. Bus A is used to provide the address for write and read operations. For example, during a write operation, if bus A indicates row 5, a write operation is performed into row 5. Similarly, during a read operation, if bus A indicates row 5, the TCAM returns the content of row 5.

Bus SDI is used both for write and search operations. During a write operation, bus DI carries the data input to be written into the data row identified by bus A and bus SDI carries the local mask to be written into the mask row identified by bus A. During a search operation, bus SDI carries the key to be searched through the TCAM.

Bus MASKB is used during search operations. In particular, bus MASKB includes column mask bits identifying which column(s) are to be masked during a search, and which column(s) are not to be masked.

Bus SCU is used to enable single clock cycle operations—when SCU is set to 1, the memory operates in single clock cycle mode (although the opposite logic is also possible). Bus CS is used to select a particular TCAM chip from a bank of multiple TCAM chips. When is set to 1, bus CS enables operations on a particular TCAM chip (although the opposite logic is also possible). Bus WE is used to enable write operations (and in some embodiments, has the opposite value relative to SCU). For example, when WE is 0, a single clock cycle write operation is enabled and, when WE is 1, a single clock cycle write operation is disabled (although the opposite logic is also possible). Bus SR is used to enable search operations. For example, when SR is 1, a search operation is enabled and, when SR is 0, search operations are disabled (although the opposite logic is also possible). Bus RD is used to enable read operations. For example, when RD is 1, a read operation is enabled and, when RD is 0, read operations are disabled (although the opposite logic is also possible).

Output bus DO is used during read operations to return the content of the row identified by the bus A. Output bus HIT is used during search operations to return the addresses of the row(s) in which a match has been identified.

Figure 2B:
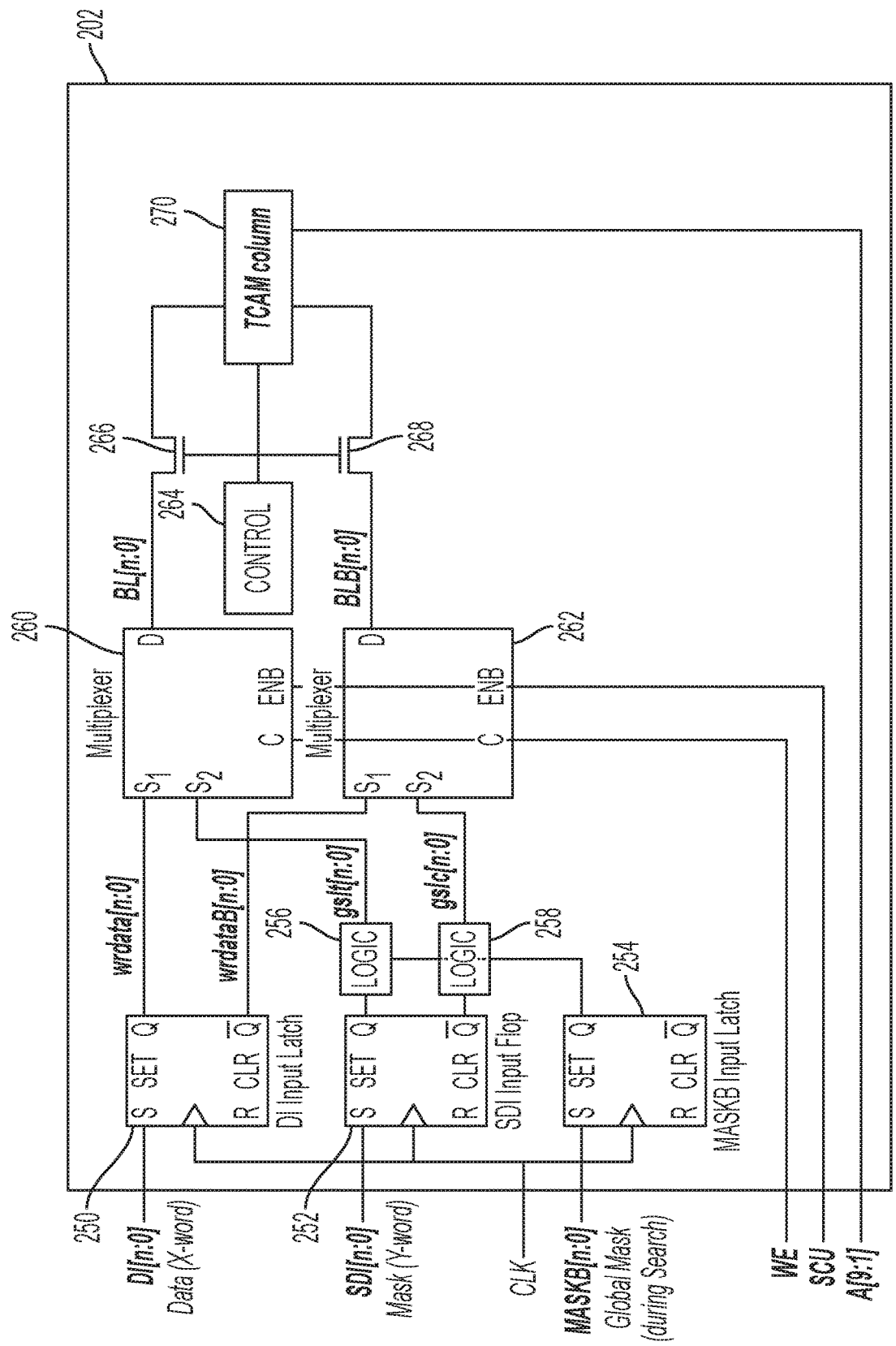
FIG. 2B is a block diagram illustrating a non-limiting implementation of the TCAM architecture of FIG. 2A, in accordance with some embodiments.

FIG. 2B illustrates a non-limiting implementation of TCAM 202, in accordance with some embodiments. In this implementation, TCAM 202 includes flip-flops 250, 252 and 254, logic unit 256 and 258, multiplexers 260 and 262, control unit 264 and TCAM column 270 includes SRAMs (or other types of memories) arranged for example as shown in FIG. 1A. TCAM 202 receives signals through buses DI, SDI, MASKB, CLK, WE, SCU and A (as discussed in connection with FIG. 2A).

Flip-flop 250 receives as input the signal of bus DI, flip-flop 252 receives as input the signal of bus SDI and flip-flop 254 receives as input the signal of bus MASKB. Clock CLK times the operations of the flip-flops. The outputs of flip-flop 250 are provided as inputs to multiplexers 260 and 262, respectively. The outputs of flip-flop 252 are provided as inputs to logic units 256 and 258, respectively. The state of the logic units is controlled by the output of flip-flop 254. The signal of bus SCU indicates whether a single-clock write operation is to be performed, whereby a data input and a mask are both written in the same clock cycle. If bus SCU is not asserted, however, write operations may be performed according to conventional schemes (whereby a data input and the corresponding mask are written in separate clock cycles). In this instance, SCU enables multiplexers 260 and 262. The signal of bus A indicates the address of the TCAM entry to be written or read. For conventional writes, when WE is 1, multiplexers 260 and 262 select the data on the DI bus (input S1 on the multiplexers is selected) for the entire clock cycle. In single clock cycle writes, the ENB signal on the multiplexers toggles based on a timed signal, within the same clock cycle, thereby selecting either S1 or S2 as inputs on the multiplexers within the same cycle. Logic units 256 and 258 are only used during a search operation. During write, logic units 256 and 258 feed through the outputs of flip-flop 252. Bus MASKB is used to mask data on a particular column during a search operation.

Figure 2C:
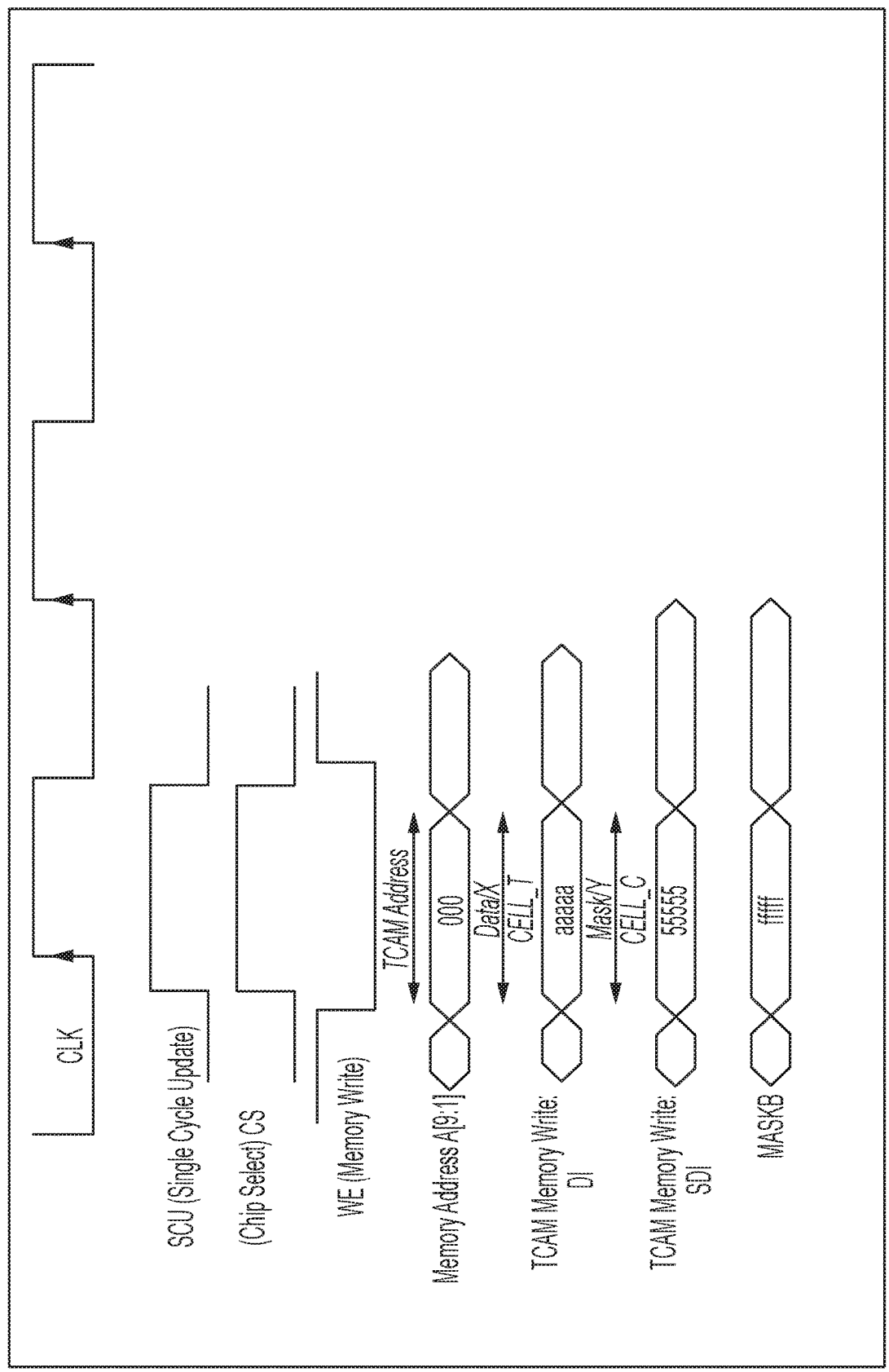
FIG. 2C is a diagram illustrating control signals used in connection with the TCAM architecture of FIG. 2A, in accordance with some embodiments.

FIG. 2C illustrates a representative write operation sequence, in accordance with some embodiments. The figure illustrates the relationship between the signals of buses CLK, SCU, CS, WE, A, DI, SDI and MASKB. When set to 1, signal CS indicates that this TCAM chip has been selected. When signal SCU is set to 1 and signal WE is set to 0, a single clock write is to be performed. In contrast, when signal SCU is set to 0 and signal WE is set to 1, a multi clock write is to be performed.

Signal A provides the address of the row to be written. In this example, the address (expressed in hexadecimals) is "000." The content of signal DI represents the data input to be written into the addressed TCAM data row. In this example, the content of DI is "aaaaa" The content of signal SDI represents the mask to be written into the addressed TCAM mask row. In this example, the content of SDI is "55555." In this sequence, both the content of DI and the content of SDI are written in a single clock cycle. During the write operation, the content of signal MASKB ("ffffff" in this example) is not considered.

Figure 3A:
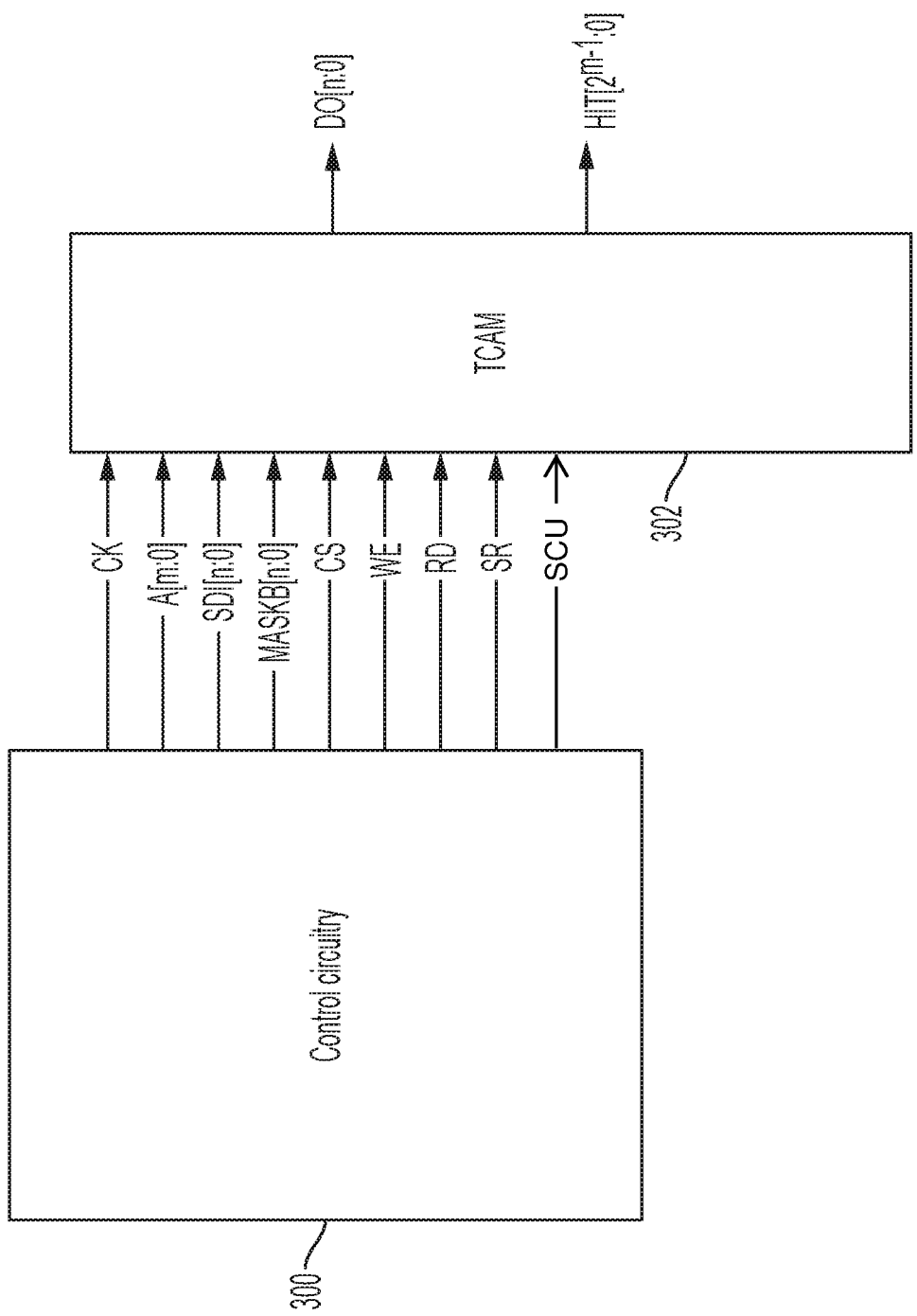
FIG. 3A is a block diagram illustrating another TCAM architecture, in accordance with some embodiments.

FIG. 3A is a block diagram illustrating another TCAM architecture, in accordance with some embodiments. Similar to the architecture of FIG. 2A, this architecture is also designed to write a data input and a local mask in a single clock cycle. However, this architecture involves fewer buses than the architecture of FIG. 2A, thereby reducing circuit complexity.

This architecture includes control circuitry 300 and TCAM 302. TCAM 302 may be arranged in accordance with the diagram illustrated in FIG. 1A. The buses of the TCAM are arranged to support write operations of data input and masks in single clock cycles. As shown in FIG. 3A, control circuitry 300 communicates with TCAM 302 using the following buses: CK, A, SDI, MASKB, CS, WE, RD, SCU and SR. It should be noted that, unlike the example of FIG. 2A, this architecture does not include bus DI. In this architecture, both buses SDI and MASKB have a dual function. During a single clock cycle write operation, bus SDI carries the data input to be written and MASKB carries the local mask to be written. During a search operation, bus SDI carries the key to be searched and MASKB carries column mask bits identifying which column(s) are to be masked (although, alternatively, bus MASKB may carry the key to be searched and SDI may carry column mask bits identifying which column(s) are to be masked). In essence, both SDI and MASKB are used in a time-multiplexed fashion. Buses CK, A, CS, WE, RD, SCU and SR have the same functions described in connection with FIG. 2A. Output bus DO and HIT also have the same functions described in connection with FIG. 2A.

Figure 3B:
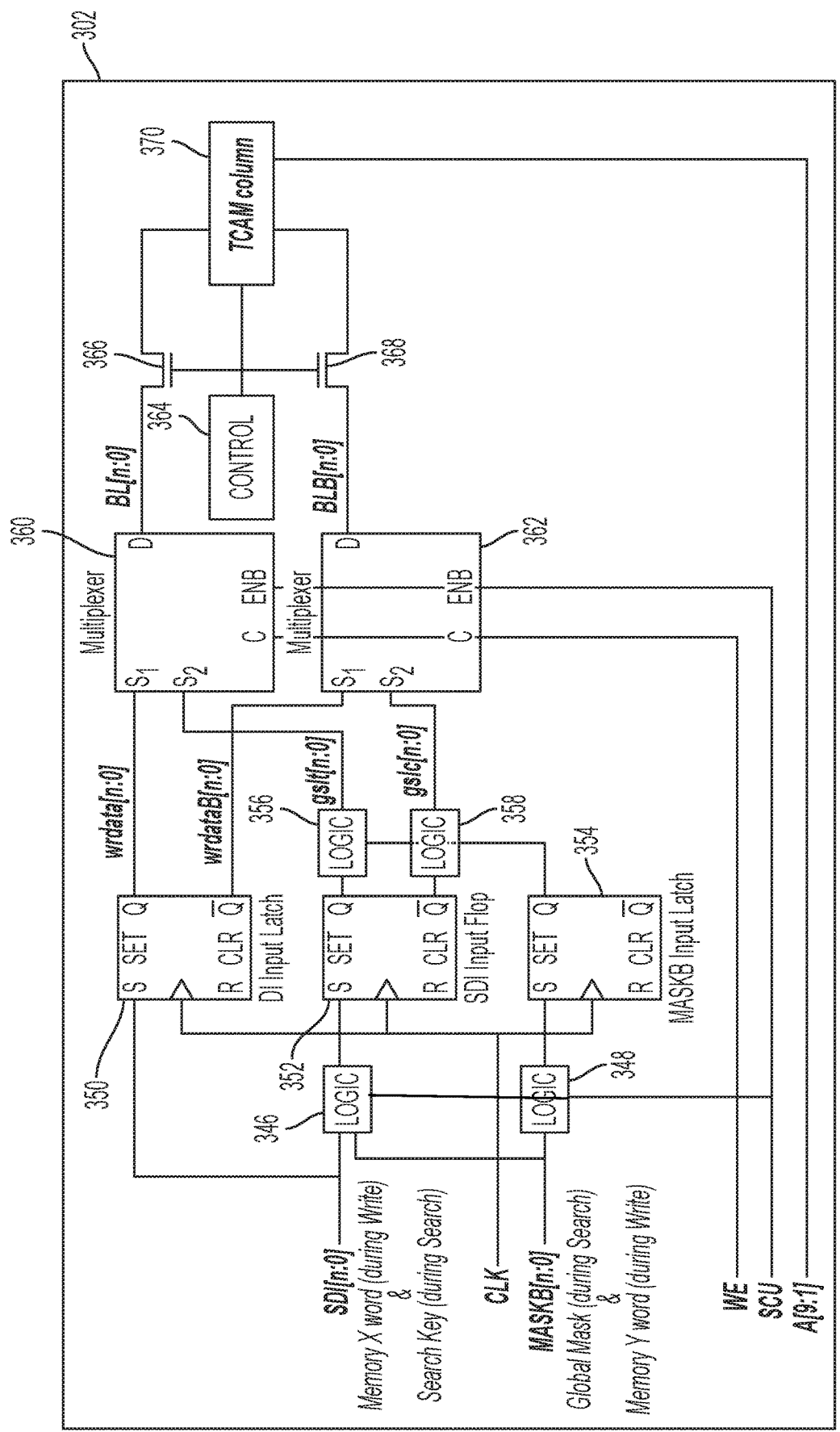
FIG. 3B is a block diagram illustrating a non-limiting implementation of the TCAM architecture of FIG. 3A, in accordance with some embodiments.

FIG. 3B illustrates a non-limiting implementation of TCAM 302, in accordance with some embodiments. In this implementation, TCAM 302 includes flip-flops 350, 352 and 354, logic units 346, 348, 356 and 358, multiplexers 360 and 362, control unit 364 and TCAM column 370. TCAM column 370 may include SRAMs (or other types of memories) arranged for example as shown in FIG. 1A. TCAM 302 receives signals through buses SDI, MASKB, CLK, WE, SCU and A (as discussed in connection with FIG. 3A Logic unit 346 receives as input the signal of bus SDI and logic unit 348 receives as input the signal of bus MASKB. The signal of bus SCU indicates whether a write operation, including writing of a data input and a mask, is to be performed in a single clock cycle or not. In this example, SCU controls the state of logic units 346 and 348.

Flip-flop 350 receives as input the signal of bus SDI, flip-flop 352 receives as input the output of logic unit 346 and flip-flop 354 receives as input the output of logic unit 348. Clock CLK times the operations of the flip-flops. The outputs of flip-flop 350 are provided as inputs to multiplexers 360 and 362, respectively. The outputs of flip-flop 352 are provided as inputs to logic units 356 and 358, respectively. The state of the logic units 356 and 358 is controlled by the output of flip-flop 354. The signal of bus A indicates the address of the TCAM row to be written or read. During write operations, the signal of bus WE is asserted, which enables use of multiplexers 360 and 362 for write operations. During a write operation, control unit 364 enables writing into TCAM column 370, and the outputs of the flip-flops are written into the TCAM array, via transistors 366 and 368. The signal of bus A determines the address of the row to be written. During a search operation, logic units 356 and 358 mask the search of a particular column, depending on the value of the corresponding mask bit of MASKB.

Figure 3C:
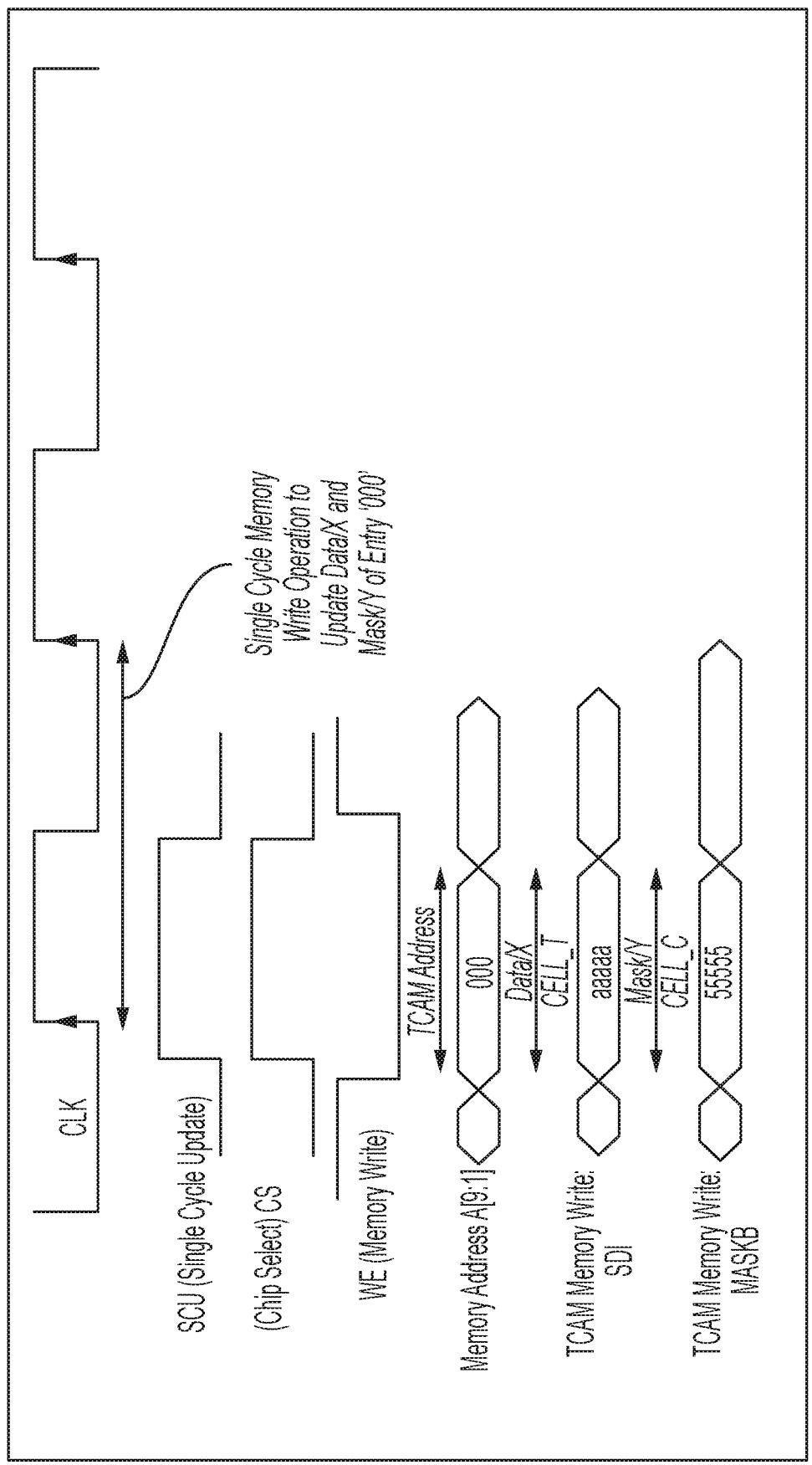
FIG. 3C is a diagram illustrating control signals used in connection with the TCAM architecture of FIG. 3A, in accordance with some embodiments.

FIG. 3C illustrates a representative write operation sequence in connection with the architecture of FIG. 3A, in accordance with some embodiments. The figure illustrates the relationship between the signals of buses CLK, SCU, WE, A, SDI and MASKB. WhenSCU is set to, CS is set to 1 and WE is set to 0, a single clock cycle write operation is to be performed in this TCAM chip.

Signal A provides the address of the row to be written. The content of signal SDI represents the data input to be written into the addressed TCAM data row. The content of signal MASKB represents the local mask to be written into the addressed TCAM mask row. In this sequence, both the content of SDI and the content of MASKB are written in a single clock cycle.

As described above, TCAMs according to the present application may be implemented using different architectures. Regardless of the specific architecture used, the TCAMs described herein are configured to perform data writes and mask writes in the same clock cycle. In some embodiments, a data write is performed in a first portion of a clock cycle, and a local mask write is performed in the second portion of the same clock cycle (though the opposite sequence is also possible). For example, a data write may be triggered by the first edge (a rising or falling edge) of a clock cycle and a mask write may be triggered by the second edge of the same clock cycle. In some embodiments, a decoder may be used to enable write operations in this manner.

Figure 4A:
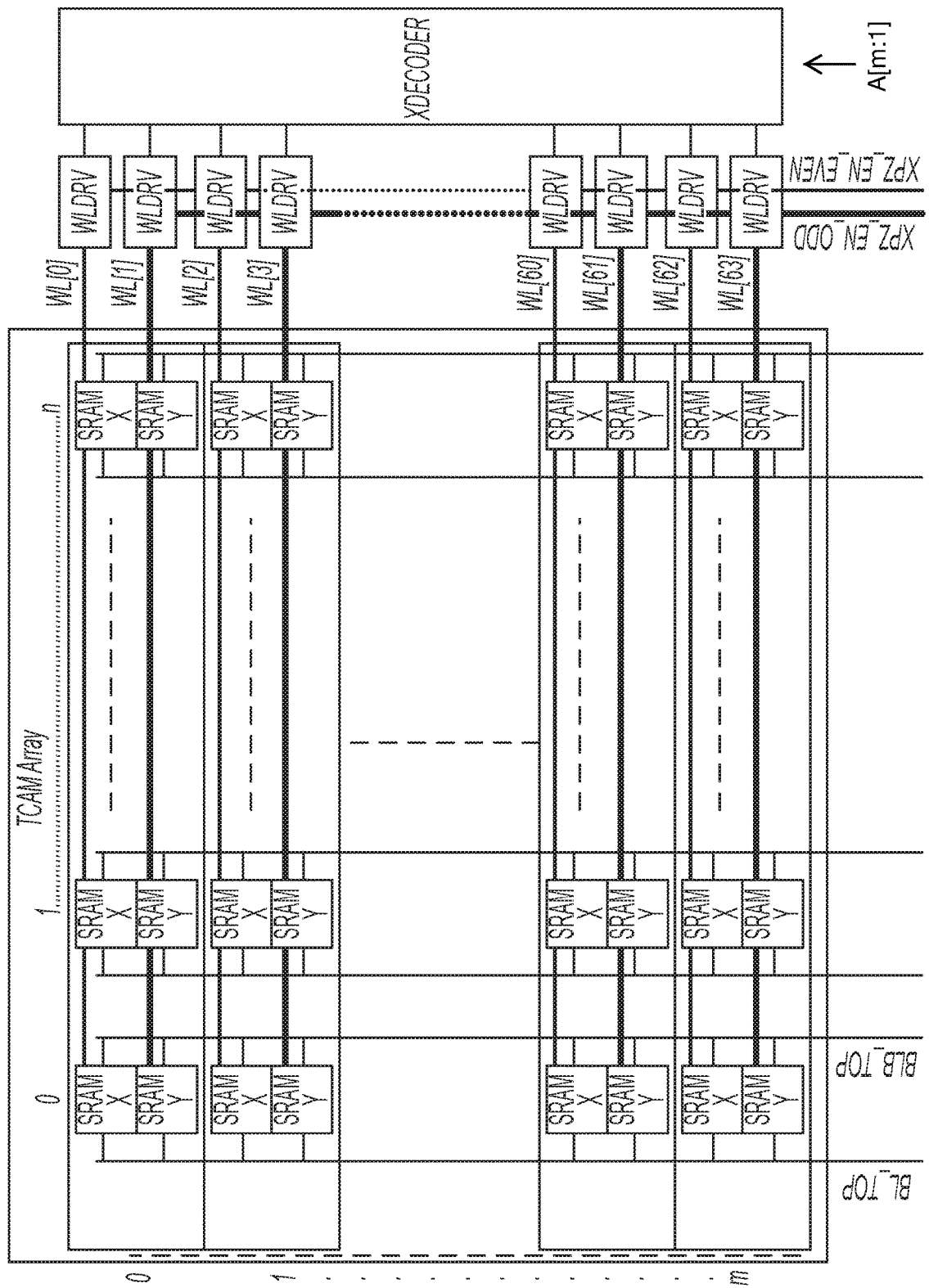
FIG. 4A is a block diagram illustrating a TCAM array coupled to a decoder, in accordance with some embodiments. in accordance with some embodiments.
Figure 4B:
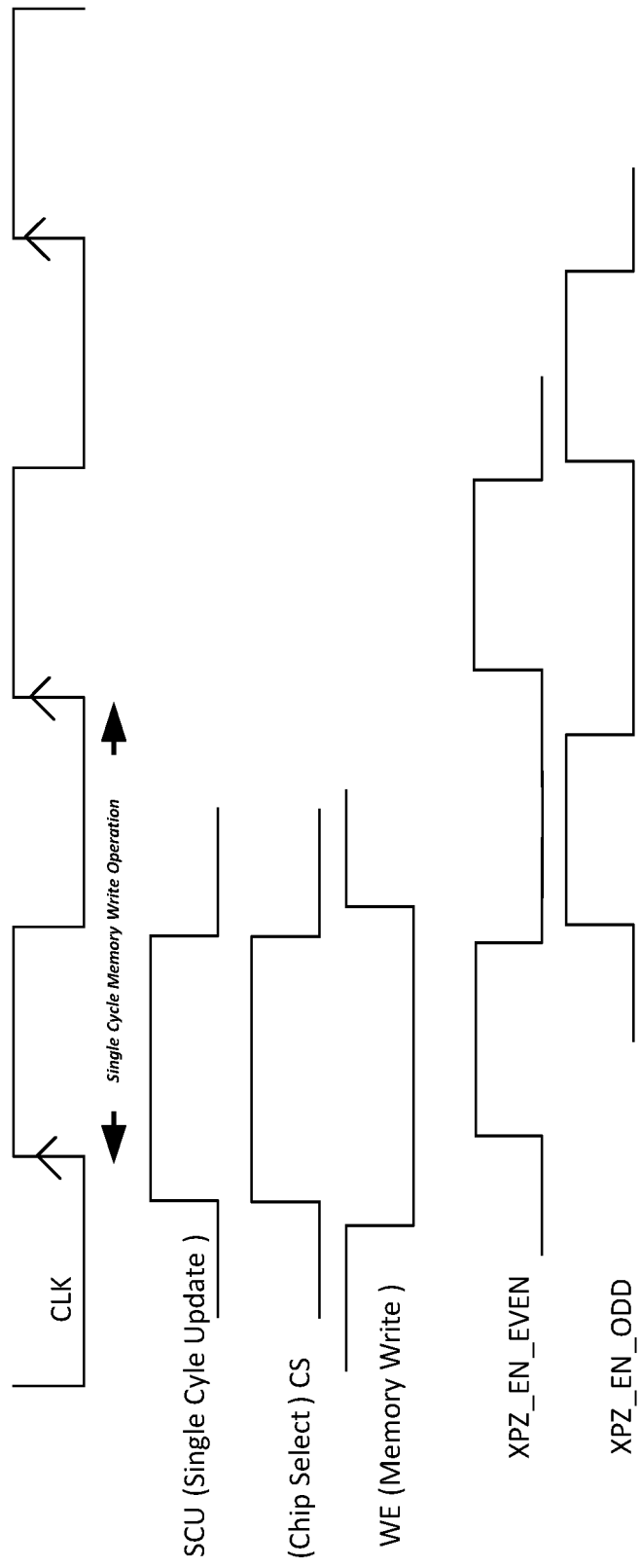
FIG. 4B is a diagram illustrating control signals used in connection with the TCAM of FIG. 4A, in accordance with some embodiments. in accordance with some embodiments.

One such decoder is depicted in FIG. 4A, in accordance with some embodiments. In this example, the TCAM array is arranged as discussed above in connection with FIG. 1A. Each row, whether a data row or a mask row, is coupled to an input register (labeled "WLDRV"). Control signals XPZ_EN_EVEN and XPZ_EN_ODD are used to control the timing with which the registers convey their respective contents to the rows of the TCAM. The decoder ("XDE-CODER") is used to select which TCAM entry is to be updated. Depending on the value of address bus A, the appropriate WLDRV is selected, which in turn is used to enable either the odd or even WL bus depending on the state of XPZ_EN_ODD or XPZ_EN_EVEN. Data received in the input buses SDI and MASKB is sent on the signals BL/BLB. Examples of these control signals are shown in FIG. 4B, in accordance with some embodiments. In this example, control signals XPZ_EN_EVEN and XPZ_EN_ODD have the same frequency as clock CLK. Further, control signals XPZ_EN_EVEN and XPZ_EN_ODD are phase-shifted relative to one another. An edge of control signal XPZ_E-N_EVEN (e.g., a rising edge) triggers a data write into a particular data row. Similarly, an edge of control signal XPZ_EN_ODD (e.g., the rising edge that immediately follows the triggering rising edge of XPZ_EN_EVEN) triggers a local mask write into the corresponding (e.g., the adjacent) mask row.

Use of ordinal terms such as "first", "second", "third", etc., in the claims to modify a claim element does not by itself connote any priority, precedence, or order of one claim element over another or the temporal order in which acts of a method are performed, but are used merely as labels to distinguish one claim element having a certain name from another element having a same name (but for use of the ordinal term) to distinguish the claim elements.

Also, the phraseology and terminology used herein is for the purpose of description and should not be regarded as limiting. The use of "including", "comprising", "having", "containing" or "involving" and variations thereof herein, is meant to encompass the items listed thereafter and equivalents thereof as well as additional items.

The use of "coupled" or "connected" is meant to refer to circuit elements, or signals, that are either directly linked to one another or through intermediate components.

The terms "approximately", "substantially," and "about" may be used to mean within ±20% of a target value in some embodiments, within ±10% of a target value in some embodiments, within ±5% of a target value in some embodiments, and within ±2% of a target value in some embodiments. The terms "approximately" and "about" may include the target value.

What is claimed is:

1. An apparatus comprising:
   a ternary content addressable memory (TCAM) comprising:
   a first plurality of rows of memory cells configured to store a plurality of respective data inputs; and
   a second plurality of rows of memory cells configured to store a plurality of respective masks;
   control circuitry configured to:
   generate a first control signal configured to write a data input in a row of the first plurality of rows of memory cells in a first clock cycle, and
   generate a second control signal configured to write a mask in a row of the second plurality of rows of memory cells in the first clock cycle;
   a first bus and a second bus, each of the first and second buses serving both as a write bus and a search bus such that:
   during a write operation, the control circuitry is configured to write the data input in the row of the first plurality of rows of memory cells using the first bus and is further configured to write the mask in the row of the second plurality of rows of memory cells using the second bus, and during a search operation, the control circuit is configured to use the first bus to search a key in the first plurality of rows of memory cells and is further configured to use the second bus to mask one or more columns of the TCAM; and a multiplexer having a first input coupled to the first bus and a second input coupled to the second bus, the multiplexer being configured to select one between the first and second inputs.

2. The apparatus of claim 1, wherein the row of the first plurality of rows and the row of the second plurality of rows share a common address.

3. The apparatus of claim 1, wherein the row of the first plurality of rows and the row of the second plurality of rows are located adjacent to one another.

4. An apparatus comprising:
a ternary content addressable memory (TCAM) comprising:
a first plurality of rows of memory cells configured to store a plurality of respective data inputs;
a second plurality of rows of memory cells configured to store a plurality of respective masks; and
first and second buses; and
control circuitry configured to:
generate a first control signal configured to write a data input in a row of the first plurality of rows of memory cells in a first clock cycle, and
generate a second control signal configured to write a mask in a row of the second plurality of rows of memory cells in the first clock cycle,
wherein each of the first bus and the second bus serves both as a write bus and a search bus such that:
during a write operation, the control circuitry is configured to write the data input in the row of the first plurality of rows of memory cells using the first bus and is further configured to write the mask in the row of the second plurality of rows of memory cells using the second bus, and during a search operation, the control circuit is configured to use the second bus to search a key in the first plurality of rows of memory cells and is further configured to use the first bus to mask one or more columns of the TCAM; and a multiplexer having a first input coupled to the first bus and a second input coupled to the second bus, the multiplexer being configured to select one between the first and second inputs.

5. The apparatus of claim 4, wherein the row of the first plurality of rows and the row of the second plurality of rows share a common address.

6. The apparatus of claim 4, wherein the row of the first plurality of rows and the row of the second plurality of rows are located adjacent to one another.

7. A method for controlling a ternary content addressable memory (TCAM) comprising:
during a write operation:
generating a first control signal for writing, using a first bus, a data input in a row of a first plurality of rows of memory cells in a first clock cycle;
generating a second control signal for writing, using a second bus, a mask in a row of a second plurality of rows of memory cells in the first clock cycle; and
using a multiplexer to select one between a first signal obtained from the first bus and a second signal obtained from the second bus; and
during a search operation:
using the first bus to search a key in the first plurality of rows of memory cells; and
using the second bus to mask one or more columns of the TCAM.

8. The method of claim 7, wherein the row of the first plurality of rows and the row of the second plurality of rows are located adjacent to one another.

9. The method of claim 7, wherein the row of the first plurality of rows and the row of the second plurality of rows share a common address.

* * * * *